US009127373B2

(12) United States Patent
Pelletier et al.

(10) Patent No.: US 9,127,373 B2
(45) Date of Patent: Sep. 8, 2015

(54) MELTING-SOLIDIFICATION FURNACE WITH VARIABLE HEAT EXCHANGE VIA THE SIDE WALLS

(75) Inventors: David Pelletier, Chambéry (FR); Jean-Paul Garandet, Le Bourget du Lac (FR)

(73) Assignee: COMMISSARIAT A L'ENERGIE ATOMIQUE ET AUX ENERGIES ALTERNATIVE, Paris (FR)

( * ) Notice: Subject to any disclaimer, the term of this patent is extended or adjusted under 35 U.S.C. 154(b) by 1025 days.

(21) Appl. No.: 13/130,188

(22) PCT Filed: Dec. 4, 2009

(86) PCT No.: PCT/EP2009/066393
§ 371 (c)(1),
(2), (4) Date: Jul. 11, 2011

(87) PCT Pub. No.: WO2010/069784
PCT Pub. Date: Jun. 24, 2010

(65) Prior Publication Data
US 2011/0259316 A1    Oct. 27, 2011

(30) Foreign Application Priority Data

Dec. 19, 2008  (FR) ..................................... 08 07241

(51) Int. Cl.
*C30B 11/02* (2006.01)
*C30B 11/00* (2006.01)
*C30B 35/00* (2006.01)

(52) U.S. Cl.
CPC ............. *C30B 11/003* (2013.01); *C30B 35/002* (2013.01)

(58) Field of Classification Search
USPC ......................... 117/81, 82, 83, 210
See application file for complete search history.

(56) References Cited

U.S. PATENT DOCUMENTS

| 5,772,761 | A | 6/1998 | Petroz |
| 2007/0227189 | A1 | 10/2007 | Sakai |
| 2008/0105193 | A1* | 5/2008 | Sachs .............................. 117/26 |
| 2011/0146566 | A1* | 6/2011 | Schmid et al. .................. 117/81 |

FOREIGN PATENT DOCUMENTS

| EP | 0 775 766 A1 | 5/1997 |
| FR | 2 553 232 A1 | 4/1985 |
| JP | U-59-143039 | 9/1984 |

(Continued)

OTHER PUBLICATIONS

International Search Report in International Application No. PCT/EP2009/066393; dated Apr. 12, 2010 (with English-language translation).

*Primary Examiner* — Robert M Kunemund
(74) *Attorney, Agent, or Firm* — Oliff PLC

(57) ABSTRACT

The melting and solidification furnace for crystalline material includes a crucible having a bottom and side walls, and means for heating the crystalline material by magnetic induction. The furnace includes at least one lateral thermal insulation system arranged at the periphery of the crucible around the side walls. At least one lateral element of the lateral thermal insulation system moves with respect to the side walls between an insulating position and a position fostering thermal leakage. The lateral thermal insulation system has an electric conductivity of less than 1 S/m and a thermal conductivity of less than 15 W/m/K.

21 Claims, 3 Drawing Sheets

(56) References Cited

FOREIGN PATENT DOCUMENTS

| JP | 02-287087 | 11/1990 |
| JP | A-05-024964 | 2/1993 |
| JP | A-09-169590 | 6/1997 |
| JP | A-2002-241859 | 8/2002 |
| JP | A-2004-010461 | 1/2004 |
| WO | WO 2005/092791 A1 | 10/2005 |
| WO | WO 2005/105670 A1 | 11/2005 |

* cited by examiner

MELTING-SOLIDIFICATION FURNACE WITH VARIABLE HEAT EXCHANGE VIA THE SIDE WALLS

BACKGROUND OF THE INVENTION

The invention relates to a melting and solidification furnace for crystalline material comprising:
- a crucible having a bottom and side walls,
- a lateral thermal insulation system arranged at the periphery of the crucible around the side walls,
- means for moving at least one lateral element of the lateral thermal insulation system with respect to the side walls between an insulating position and a position fostering thermal leakage.

STATE OF THE ART

In conventional manner, crystalline materials, typically semi-conductor materials and metal materials, cannot be used as such in the different technological fields on account of an insufficient purity and/or an unsuitable crystalline structure. For crystalline materials to be able to comply with very stringent requirement specifications, they are subjected to different melting-solidification cycles in order for example to reduce the quantity of impurities in the material and/or to impose a crystalline organization in the final solid material.

Purification of the crystalline material can be performed a first time in the melting phase using a liquid-phase purification method, for example with a plasma torch. Purification can also be performed during solidification, as the impurities segregate preferentially from solid phase to the molten material. In conventional manner, the solidification phase is used to define the crystalline phase of the crystalline material.

In conventional manner, the material to be crystallized is placed in the form of a feedstock in a crucible which is itself placed in a vertical furnace. The furnace comprises heating means to melt the crystalline material and cooling means to impose a very particular thermal gradient on the molten material during the cooling phase of the molten material. The heating means are for example chosen of inductive type as they enable the crystalline material to be heated while at the same time performing stirring of the molten material.

However, during the different treatment phases of the material to be crystallized, the functionalities of the treatment furnace and of its constituent elements are different. First of all, when melting of the material takes place, a very good insulation of the furnace and especially of the crucible is necessary in order to reduce heat losses thereby ensuring a sufficient efficiency of the furnace.

In the case of purification, control of the furnace temperature is important, as is obtaining efficient stirring. It is therefore important to control the quantity of energy supplied to the crucible with respect to the energy lost by the crucible to control the temperature of the molten material. Furthermore, good stirring ensures renewal of the free surface with pollutant. As stipulated in the foregoing, the inductive heating means perform both heating and stirring of the liquid bath. The higher the current flowing in the coils, the greater the stirring and heating, and it is then very difficult to strictly control the furnace temperature in precise manner while at the same time maintaining a high stirring, these two conditions being contradictory.

In the case of directional solidification, heat extraction from the material has to be controlled perfectly, as it is the thermal gradient applied to the crucible that conditions the advance of the solidification front and therefore the crystallographic quality of the final material. Furthermore, during crystallization, the liquid phase is also stirred to ensure a homogeneous distribution of the elements constituting the material.

The document WO 2005/105670 describes an installation for producing blocks of semi-conductor material. This installation comprises two distinct chambers dedicated to specific operations. A first chamber and a first crucible are used for performing melting and purification of the semi-conductor material. A second chamber and a second crucible are then used to perform crystallization. This installation is complex and requires means for transferring the molten material from the first crucible to the second crucible. This installation occupies a large surface as two chambers have to be installed and managed.

The document FR 2553232 describes a device for producing an ingot from a polycrystalline semi-conductor material. This device comprises a crucible inside which a semi-conductor material is placed. The device comprises induction heating means and the crucible is thermally insulated by means of a carbon felt arranged against the side walls and the bottom of the crucible. The device performs melting and crystallization of the semi-conductor material in the same crucible. Crystallization is obtained by removing the felt which is placed under the crucible, which creates a heat leakage via the bottom of the crucible. However, the thermal gradient perpendicular to the bottom of the crucible induces a stabilizing temperature gradient (cold at the bottom) in the molten material, which opposes the stirring movements necessary for obtaining a homogeneous material.

OBJECT OF THE INVENTION

The object of the invention is to provide a melting-crystallization furnace that is easy to implement, that only uses a single crucible for melting and crystallization and that enables overheating of the molten material to be controlled while at the same time having a high stirring rate.

The furnace according to the invention is characterized by the appended claims and more particularly by the fact that:
- the lateral thermal insulation system has an electric conductivity of less than 1 S/m and a thermal conductivity of less than 15 W/m/K,
- the means for moving comprise means for moving at least one lateral element of the lateral thermal insulation system in a lateral direction,
- said lateral thermal insulation system is formed by at least two adjacent sub-elements forming a ring that is continuous in the insulating position and discontinuous in the position fostering heat leakage, and by the fact that it comprises means for heating the crystalline material by electromagnetic induction.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
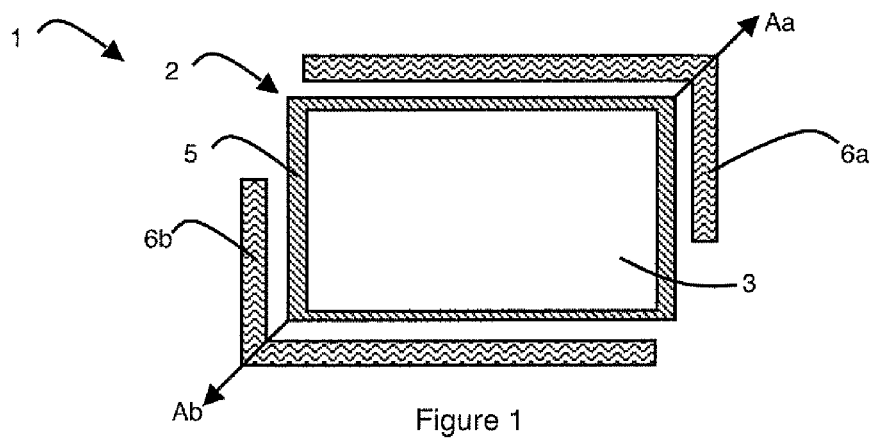
FIG. 1 represents, in schematic manner, a top view of a particular embodiment of a crucible and of a lateral thermal insulation element according to the invention.

As illustrated in FIGS. 1 to 6, the melting-solidification furnace 1 comprises a crucible 2 in which a crystalline material 3 of semi-conductor or metal type is placed. Furnace 1 also comprises a heating device of the crystalline material 3 by electromagnetic induction (not shown). The heating device is composed for example of one or more coils inside which an alternating current of predefined frequency flows.

Crucible 2 has a bottom 4 and side walls 5 made from non-cooled refractory material, the crucible therefore being of hot crucible type. Side walls 5 are oriented in a longitudinal direction L which is perpendicular to bottom 4 of crucible 2. Walls 5 have a height h from bottom 4 of crucible 2 in longitudinal direction L. Crucible 2 presents an outer surface which corresponds to the outer surface of its side walls 5. Crucible 2 is associated with modulating means of the lateral heat leakage. These modulating means enable the proportion of thermal energy leaving crucible 2 via its side walls 5 to be varied. The energy flux leaving the crucible passing through the outer surface of crucible 2 can be then modulated.

For this, furnace 1 comprises an annular-shaped lateral thermal insulation system 6 arranged at the periphery of crucible 2 around side walls 5. Lateral thermal insulation system 6 is mobile with respect to crucible 2. Advantageously, at least side walls 5 of crucible 2 are overlapped by an additional insulating material (not shown) which is fixed with respect to crucible 2 and which performs a first thermal insulation of crucible 2. Lateral thermal insulation system 6 comprises at least one lateral thermal insulation element 7 which moves with respect to crucible 2.

In an alternative embodiment, lateral thermal insulation system 6 comprises a main lateral thermal insulation element 7 and an additional lateral thermal insulation element 7' (FIGS. 2 to 6). Main lateral thermal insulation element 7 is then surrounded by a distinct additional lateral thermal insulation element 7'. These two lateral thermal insulation elements 7 and 7' are mobile and can move independently from one another.

If lateral thermal insulation system 6 only comprises a single lateral thermal insulation element, i.e. lateral thermal insulation element 7, the latter can be assimilated to system 6 and it can be noted as lateral thermal insulation element 6.

The means for modulating lateral thermal leakage comprise moving means of the lateral thermal insulation system 6 with respect to the side walls of crucible 2. According to the embodiments, the moving means can also comprise independent moving means for main lateral thermal insulation element 7 and for additional lateral thermal insulation element 7'. Lateral thermal insulation system 6 then moves between an insulating position and a position which fosters thermal leakage via side walls 5.

The moving means can comprise moving means of at least one lateral thermal insulation element 7, 7' in the longitudinal direction L. This embodiment is advantageous if lateral thermal insulation element 7, 7' has a height equal to that of crucible 2. Advantageously, in this insulating position, the whole height of lateral thermal insulation element 7, 7' is overlapping the side walls so as to reduce losses as far as possible.

Figure 2:
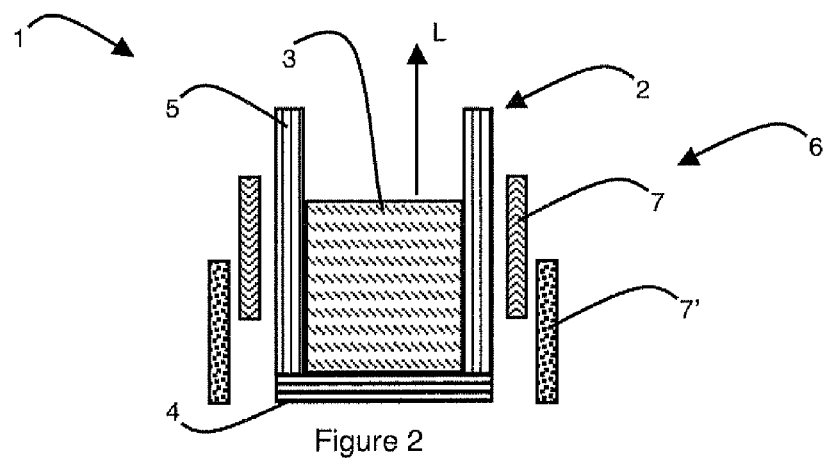
FIGS. 2 and 3 represent, in schematic manner, in longitudinal cross-section, another particular embodiment of a crucible and of lateral thermal insulation elements according to the invention, in two different insulation configurations.
Figure 3:
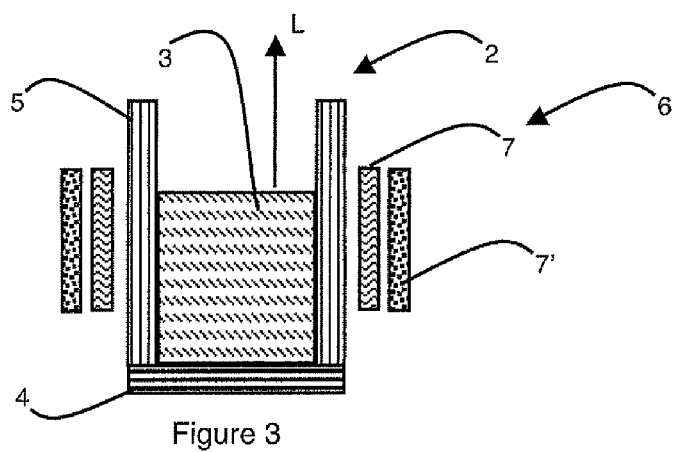

As illustrated in FIGS. 2 and 3, the modulating means comprise moving means of main lateral thermal insulation element 7 and of additional lateral thermal insulation element 7' in the longitudinal direction L. In this case, lateral thermal insulation elements 7 and 7' move with respect to bottom 4 of crucible 2 and the distance separating the lateral thermal insulation elements from side walls 5 is constant.

This embodiment is advantageous if lateral thermal insulation elements 7 and 7' are of smaller height than that of crucible 2 and particularly smaller than that of the quantity of molten material in crucible 2. In an insulating position called vertical, lateral thermal insulation elements 7 and 7' cover the whole of the height of side walls 5 while at the same time having the maximum surface overlapping one another. In order to increase thermal leakage via side walls 5, coverage of the whole of the height of side walls 5 is no longer ensured. Lateral thermal insulation elements 7 and 7' move towards one another by a longitudinal movement. It is lateral thermal insulation element 7 or 7' that covers the bottom part of side walls 5 which moves longitudinally towards the top part of side walls 5.

In another embodiment that can be combined with the previous embodiment, the moving means can also comprise moving means of lateral thermal insulation element 6 in a lateral direction. The lateral direction of movement is perpendicular to the longitudinal direction L. In this case, lateral thermal insulation system 6 comprises at least one lateral thermal insulation element which must be divided into a plurality of sub-elements so as to allow each of the sub-elements to be moved towards or away in a direction that is proper thereto. In other words, the modulating means of lateral thermal leakage comprise moving means of each sub-element independently from the others.

Lateral thermal insulation system 6 is then formed by at least two sub-elements 6a, 6b (FIG. 1). The lateral thermal insulation element is cut along at least a first cutting plane secant to the bottom of crucible 2.

Figure 4:
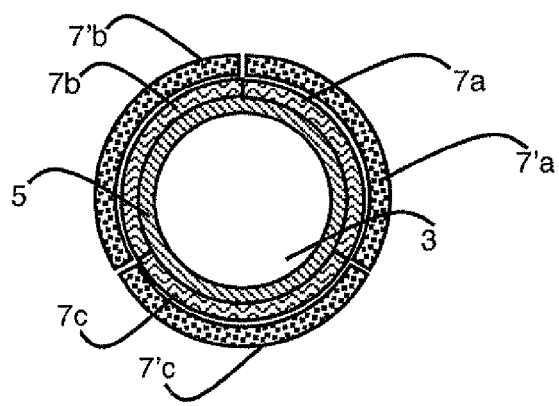
FIGS. 4 to 6 represent, in schematic manner, top views of a third particular embodiment of a crucible and of lateral thermal insulation elements according to the invention, in different insulation configurations.
Figure 5:
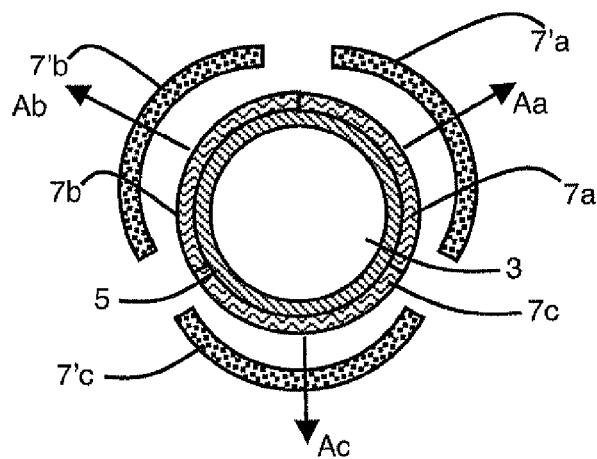
Figure 6:
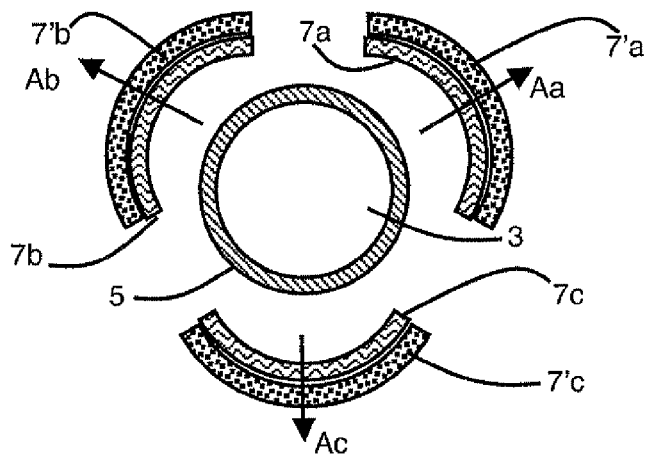
Figure 7:
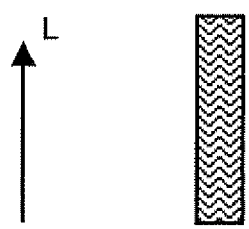
FIGS. 7 and 8 represent, in schematic manner, longitudinal cross-sections of a lateral thermal insulation element according to the invention.
Figure 8:
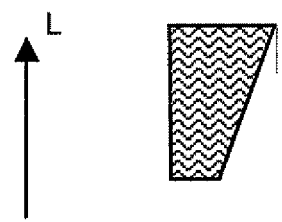

As illustrated in FIGS. 4 to 6, main lateral thermal insulation element 7 is formed by three sub-elements 7a, 7b and 7c which form a ring surrounding crucible 2. This ring is continuous when the lateral thermal insulation element is in an insulating position, i.e. all the sub-elements are joined. In a position fostering thermal leakage, the sub-elements are no longer joined and the ring is discontinuous.

The same is the case for lateral thermal insulation system 6 which surrounds the rectangular crucible of FIG. 1.

In similar manner, additional lateral thermal insulation element 7' is formed by three sub-elements 7'a, 7'b, 7'c in FIGS. 4 to 6. Lateral thermal insulation elements 7 and 7' can be cut along different cutting planes secant to the bottom of crucible 2.

Each sub-element 6a, 6b, 7a, 7b, 7c, 7'a, 7'b, 7'c comprises two main surfaces and four secondary surfaces. The main surface located overlapping the outer surface of the side wall of the crucible is called the inner surface of the sub-element. The main surface directed towards the outside is called the outer surface of the sub-element. The inner surface of a sub-element is complementary to the outer surface of the sub-element or of the overlapping crucible. Thus, for example purposes, the inner surface of sub-elements 6a and 7a are substantially complementary to the facing outer surface of the crucible so that they can encase on one another. Lateral thermal insulation elements 6 and 7 can thus surround side walls 5 of crucible 2 in order to achieve a maximal thermal insulation.

In the same way, the overlapping inner and outer surfaces of main lateral thermal insulation element 7 and additional thermal insulation element 7' are complementary so that they can encase on one another. Additional lateral thermal insulation element 7' can thus surround the side walls of main lateral thermal insulation element 7 in order to have a maximal thermal insulation in its insulating position.

As illustrated in FIGS. 3 to 6, the modulating means can comprise moving means of lateral insulation elements 7 and 7' in lateral directions A. Each lateral insulation element 7 and 7' being composed of a plurality of sub-elements, these sub-elements move in a lateral direction which is proper thereto and predefined, Aa, Ab, Ac in FIG. 4. This lateral direction of movement can then be radial or tangential. It can thus be envisaged to have a tangential movement with respect to the lateral surfaces, i.e. a movement along a tangent to a radius of a cylindrical crucible or in a direction parallel to a lateral surface of a crucible with a square or rectangular base. It can also be envisaged to have a radial movement.

This lateral direction of movement is perpendicular to the longitudinal direction L of crucible 2 and passes through a characteristic point of each elementary insulator (7a-7c, 7'a-7'c). The lateral direction of movement A can be a vector orthogonal to the flat inner surface of the sub-element. In the case of the parallelepiped, the lateral direction of movement can further be the direction that ensures that an identical separating distance is obtained between the different surfaces of the sub-element and the facing side walls of crucible 2.

The cutting planes of lateral thermal insulation elements 7 and 7' are advantageously identical, but they can also be offset. It can also be envisaged for lateral thermal insulation elements 7 and 7' not to have the same number of sub-elements. Lateral thermal insulation elements 7 and 7' being able to be divided according to different cutting planes, a sub-element of main lateral thermal insulation element 7 can for example overlap two sub-elements of additional lateral thermal insulation element 7'. They do not therefore have to have the same directions of movement, unlike the particular case illustrated in FIGS. 4 to 6.

In a particular embodiment combinable with the previous embodiments, the inner surface of lateral thermal insulation system 6 or of main lateral thermal insulation element 7 is slightly larger than the outer surface of crucible 2 so that, in an insulating position, a predefined thin film of air or gas is present between crucible 2 and lateral insulation element 6 or 7, and therefore between crucible 2 and each of the sub-elements. The same can be the case between main lateral thermal insulation element 7 and additional lateral thermal insulation element 7' so that, in an insulating position, a predefined thin film of air or gas is present between these two elements 7 and 7'.

If crucible 2 is cylindrical in shape, sub-elements 7, 7' of lateral thermal insulation system 6 are advantageously in the form of an arc of a circle of predefined thickness. If crucible 2 is square-based or rectangular-based, the inner surface of the sub-elements can be a flat surface. However, if the sub-element is overlapping an edge of crucible 2, its inner surface is said to be complex and comprises an angle between two flat surfaces (FIG. 1).

In order to be usable in a melting, purification and solidification phase, lateral thermal insulation system 6 moves between an insulating position and a position fostering thermal leakage via side walls 5. Typically, lateral thermal insulation system 6 moves towards or away from side walls 5 or bottom 4 of crucible 2.

As illustrated in FIGS. 3 to 6, in its insulating position, the distance between crucible 2 and lateral thermal insulation system 6 is the smallest authorized, which results in a minimum distance of main lateral element 7 and additional lateral element 7' with respect to side walls 5. This minimum distance can be zero or equal to a predefined thickness. In its position fostering thermal leakage, the distance between crucible 2 and lateral thermal insulation system 6 is the largest authorized and the thermal leakage via side walls 5 is greatest.

In this way, according to the configuration taken by the modulating means, the thermal leakage via the side walls of the crucible can be very small or larger, the proportion of leakage via the side walls being able to vary in continuous or discontinuous manner.

In the melting phase, leakage is reduced to the minimum which enables both efficient heating and stirring to be had with the induction heating means while at the same time keeping a good energy efficiency of this operation. When crystallization takes place, the thermal leakage via the side walls is greater and can increase in continuous manner or in discrete manner as crystallization progresses to adjust to a modification of the thermal conductance of the material in the crucible.

In this embodiment, it is advantageous for the modulating means to comprise moving means of lateral insulation system 6, for example lateral insulation elements 7 and 7', in rotation around the longitudinal axis of crucible 2. Performing rotation of lateral system 6 or of elements 7 and 7' independently from one another prevents cold areas, which are particularly detrimental, from forming on the crucible. Elements 7 and 7' can move independently from one another, one of the two therefore being able to be fixed with respect to the other, or they can move at different speeds or in opposite directions.

The longitudinal position of lateral thermal insulation element 6 with respect to bottom 4 of crucible 2 enables a more or less large thermal gradient to be created over the height of crucible 2.

In another particular embodiment which corresponds to a combination of the different embodiments of FIGS. 1 to 6, lateral thermal insulation system 6 can be mobile in a longitudinal direction and in a lateral direction. This embodiment can obviously be applied to main lateral thermal insulation element 7 and additional thermal insulation element 7'. Lateral insulation elements 7 and 7' can therefore both move in the longitudinal and lateral directions. It is also conceivable for main lateral thermal insulation element 7 to move in a longitudinal direction and additional lateral thermal insulation element 7' to move in a lateral direction.

The insulating material constituting lateral thermal insulation system 6 is advantageously formed from an electrically insulating material so as to limit electromagnetic coupling generated by the furnace heating means as far as possible. The material insulating presents an electric conductivity of less than 1 S/m. The material insulating is also chosen from materials presenting a low thermal conductivity, typically less than 15 W/m/K.

The insulating material of lateral thermal insulation system 6 can be chosen for example from alumina, Macor™, mullite or zircon. All the lateral thermal insulation elements and sub-elements are advantageously made from the same material.

The insulating material advantageously presents an emissivity comprised between 0.3 and 0.6. If the emissivity is low, the thermal insulating nature of the lateral thermal insulator and of the additional lateral thermal insulator is in fact enhanced, but the inertia of the furnace increases.

The furnace can operate in a vacuum or in a controlled gaseous atmosphere. This gaseous atmosphere can be formed by a gas chosen from argon, oxygen, hydrogen, helium, nitrogen or air or a mixture based on these gases. Advantageously the atmosphere is formed by a neutral gas or a mixture of neutral gases.

The heat losses via side walls 5 are achieved by radiation and by convection if furnace 1 comprises a gaseous atmosphere.

In the longitudinal direction, the thickness of lateral thermal insulation system 6 and/or of elements 7 and 7' is constant or it can present a continuous variation. The cross-section of lateral thermal insulation element 7 and 7' in a cutting plane perpendicular to the bottom of the crucible is in the shape of a rectangle or a rectangular trapezoid. If the thickness is not constant over the whole height of lateral thermal insulation element 6, 7, 7', the largest thickness is advantageously situated in the top part of the thermal insulator. This variation of thickness also enables a more or less large axial thermal gradient to be created over the height of crucible 2.

In a particular embodiment, a plurality of holes are drilled in the lateral thermal insulator and/or the additional lateral thermal insulator to modulate the thermal leakage. It may also be advantageous to control the rotation or the angle of offset between lateral insulation elements 7 and 7' so as to completely/partially obstruct the holes of main lateral thermal element 7 by additional lateral thermal element 7'. This operating mode is particularly advantageous in the case of a cylindrical crucible.

In this embodiment, the modulating means can comprise moving means of lateral insulation system 6, for example lateral insulation elements 7 and 7', in rotation around the longitudinal axis of crucible 2.

The thickness of lateral thermal insulation system 6 or the sum of the thicknesses of elements 7 and 7' is advantageously comprised between 2 and 20 mm, even more advantageously between 5 and 10 mm. The height of lateral thermal insulation system 6 is typically comprised between 10 and 20 cm.

For example purposes, the movement in the lateral direction between lateral thermal insulation system 6 and the crucible can be comprised between 0 and 10 cm.

Also for example purposes, the longitudinal movement of lateral thermal insulation system 6 is comprised between 5 and 15 cm.

The heat extracted from crucible 2 is modulated by the variation of the geometric configuration of crucible 2 with respect to lateral thermal insulation element 6 and to elements 7 and 7' if applicable. Modulation of the heat flux can be achieved by modulating either alone or in combination:
the distance, in a lateral direction, between lateral thermal insulation system 6 and side walls 5,
the distance, in a lateral direction, between main lateral thermal insulation element 7 and additional lateral thermal insulation element 7 and the distance separating the latter from the crucible,
the overlap, in a vertical direction, of lateral thermal insulation element 6, or of elements 7 and 7', with side walls 5 of crucible 2,
the overlap of elements 7 and 7' with one another in a vertical direction,
the composition of the gaseous atmosphere inside furnace 1,
the overlap by angular rotation.

For example purposes, a crystal growth furnace according to the invention is a furnace suitable for silicon which can be achieved in the following manner. The modulating means of the lateral heat losses comprise a main lateral thermal insulation element and an additional lateral thermal insulation element. These two lateral thermal insulation elements are made from alumina. The crucible is of cylindrical type, like that of FIG. 3. The diameter of the crucible is equal to 20 cm and the side walls have a height equal to 25 cm. The lateral thermal insulation elements have a height equal to 15 cm and a thickness equal to 8 mm. The furnace also comprises a fixed insulating material the thickness of which is equal to 5 cm. In operation, the temperature of the inner surface of the insulation is about 800° C.

During the melting phase, the lateral thermal insulation elements are in an insulating position. They are joined to the crucible in order to reduce the heat losses via the side walls of the crucible to the maximum. This insulating position is illustrated in FIG. 2 or 4. The heat flux extracted from the crucible via the side walls is then about 10 kW. Once solidification has been initiated, the additional lateral thermal insulation element moves longitudinally in continuous manner with a speed that is linked to the solidification rate of the silicon from the bottom of the crucible. The solidification direction of the silicon is identical to the direction of movement of the additional lateral thermal insulation element. The solidification rate is about 10 mm/h.

At the end of solidification, when there is hardly any molten material left, the additional lateral thermal insulation element is moved 10 cm longitudinally and this configuration is illustrated in FIG. 3 or 6. The heat flux extracted via the side walls is about 13 kW, which represents an increase of 30% of the extracted flux with respect to the insulation configuration.

In the case where the two lateral thermal insulation elements are not made from alumina but from Macor™, the increase of the extracted flux with respect to the insulation configuration is about 75%.

The furnace comprises cooling means which are arranged underneath the bottom of the crucible in order to impose a vertical thermal gradient.

The invention claimed is:

1. A melting and solidification furnace for crystalline material comprising:
a crucible having a bottom, side walls and a longitudinal axis perpendicular to the bottom,
a lateral thermal insulation system arranged around the crucible and overlapping the side walls, the lateral thermal insulation system comprising a plurality of sub-elements configured to form a ring that is continuous in a first position and discontinuous in a second position fostering thermal leakage, and the lateral thermal insulation system comprises a main lateral insulation element and an additional lateral insulation element, the main lateral insulation separating the crucible from the additional lateral insulation element,
a device for roving one of the sub-elements in a first direction between the first position and the second position, the first direction being perpendicular to the longitudinal direction, and
a device for moving the additional lateral insulation element in the longitudinal direction.

2. The furnace according to claim 1, comprising a device for moving each of the sub-elements in a plurality of directions being perpendicular to the longitudinal direction.

3. The furnace according to claim 1, comprising a device for moving the main lateral insulation element in the longitudinal direction.

4. The furnace according to claim 1, wherein the lateral thermal insulation system presents an emissivity comprised between 0.3 and 0.6.

5. The furnace according to claim 1, wherein the lateral thermal insulation system has an identical or smaller height to a height of the side walls according to the longitudinal direction.

6. The furnace according to claim 1, wherein the lateral thermal insulation system has a rectangular cross-section or a rectangular trapezoidal cross-section in a plane perpendicular to the bottom of the crucible.

7. The furnace according to claim 1,
wherein in the first position the ring is covering the side walls and in the second position the crucible is separated from the ring by a gap.

8. A melting and solidification furnace for crystalline material comprising:
a crucible having a bottom, side walls and a longitudinal axis perpendicular to the bottom,
a lateral thermal insulation system arranged around the crucible and overlapping the side walls, the lateral thermal insulation system comprising a plurality of sub-elements configured to form a ring that is continuous in a first position and discontinuous in a second position fostering thermal leakage, and the lateral thermal insulation system comprises a main lateral insulation element and an additional lateral insulation element, the main lateral insulation separating the crucible from the additional lateral insulation element,
a device for moving one of the sub-elements in a first direction between the first position and the second position, the first direction being perpendicular to the longitudinal direction, and
a device for moving the main lateral insulation element in rotation with respect to the longitudinal axis.

9. A melting and solidification furnace for crystalline material comprising:
a crucible having a bottom, side walls and a longitudinal axis perpendicular to the bottom,
a lateral thermal insulation system arranged around the crucible and overlapping the side walls, the lateral thermal insulation system comprising a plurality of sub-elements configured to form a ring that is continuous in a first position and discontinuous in a second position fostering thermal leakage, and the lateral thermal insulation system comprises a main lateral insulation element and an additional lateral insulation element, the main lateral insulation separating the crucible from the additional lateral insulation element,
a device for moving one of the sub-elements in a first direction between the first position and the second position, the first direction being perpendicular to the longitudinal direction, and
a device for moving the additional lateral insulation element in rotation with respect to the longitudinal axis.

10. The furnace according to claim 8, comprising a device for moving each of the sub-elements in a plurality of directions being perpendicular to the longitudinal direction.

11. The furnace according to claim 8, comprising a device for moving the main lateral insulation element in the longitudinal direction.

12. The furnace according to claim 8, wherein the lateral thermal insulation system presents an emissivity comprised between 0.3 and 0.6.

13. The furnace according to claim 8, wherein the lateral thermal insulation system has an identical or smaller height to a height of the side walls according to the longitudinal direction.

14. The furnace according to claim 8, wherein the lateral thermal insulation system has a rectangular cross-section or a rectangular trapezoidal cross-section in a plane perpendicular to the bottom of the crucible.

15. The furnace according to claim 8, wherein in the first position the ring is covering the side walls and in the second position the crucible is separated from the ring by a gap.

16. The furnace according to claim 9, comprising a device for moving each of the sub-elements in a plurality of directions being perpendicular to the longitudinal direction.

17. The furnace according to claim 9, comprising a device for moving the main lateral insulation element in the longitudinal direction.

18. The furnace according to claim 9, wherein the lateral thermal insulation system presents an emissivity comprised between 0.3 and 0.6.

19. The furnace according to claim 9, wherein the lateral thermal insulation system has an identical or smaller height to a height of the side walls according to the longitudinal direction.

20. The furnace according to claim 9, wherein the lateral thermal insulation system has a rectangular cross-section or a rectangular trapezoidal cross-section in a plane perpendicular to the bottom of the crucible.

21. The furnace according to claim 9, wherein in the first position the ring is covering the side walls and in the second position the crucible is separated from the ring by a gap.

* * * * *